(12) United States Patent
Chen et al.

(10) Patent No.: US 11,991,874 B2
(45) Date of Patent: May 21, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Longyang Chen, Hefei (CN); Gongyi Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 475 days.

(21) Appl. No.: 17/389,486

(22) Filed: Jul. 30, 2021

(65) Prior Publication Data

US 2022/0052049 A1 Feb. 17, 2022

Related U.S. Application Data

(63) Continuation of application No. PCT/CN2021/093137, filed on May 11, 2021.

(30) Foreign Application Priority Data

Aug. 13, 2020 (CN) .......................... 202010812819.3

(51) Int. Cl.
  *H10B 12/00* (2023.01)
(52) U.S. Cl.
  CPC .......... *H10B 12/30* (2023.02); *H10B 12/482* (2023.02)

(58) Field of Classification Search
  CPC .............................. H10B 12/30; H10B 12/482
  See application file for complete search history.

(56) References Cited

U.S. PATENT DOCUMENTS

| | | | |
|---|---|---|---|
| 9,613,966 B2 | 4/2017 | Kim et al. | |
| 10,522,548 B2 | 12/2019 | Chun | |
| 2007/0290249 A1 | 12/2007 | Popp | |
| 2008/0126014 A1 | 5/2008 | Cui | |
| 2015/0380508 A1 | 12/2015 | Kim et al. | |
| 2017/0005097 A1 | 1/2017 | Kim et al. | |
| 2022/0028730 A1* | 1/2022 | Chou | H01L 21/31055 |

FOREIGN PATENT DOCUMENTS

| CN | 108172620 A | * | 6/2018 | ..... H01L 21/823431 |
|---|---|---|---|---|
| CN | 108172620 A | | 6/2018 | |
| CN | 108231738 A | | 6/2018 | |
| CN | 111463207 A | | 7/2020 | |
| CN | 211182205 U | | 8/2020 | |

\* cited by examiner

*Primary Examiner* — Kyoung Lee
*Assistant Examiner* — Sophia W Kao
(74) *Attorney, Agent, or Firm* — Syncoda LLC; Feng Ma

(57) ABSTRACT

A semiconductor structure includes a substrate, a bit line, and a first isolation layer. A groove is set in the substrate. A bottom end of the bit line is set in the groove. The first isolation layer is at least partially set on a sidewall of the bit line, and the first isolation layer is in direct contact with the bit line.

18 Claims, 7 Drawing Sheets

SEMICONDUCTOR STRUCTURE AND MANUFACTURING METHOD THEREOF

CROSS-REFERENCE TO RELATED APPLICATIONS

This is a continuation of International Application No. PCT/CN2021/093137 filed on May 11, 2021, which claims priority to Chinese Patent Application No. 202010812819.3 filed on Aug. 13, 2020. The disclosures of these applications are hereby incorporated by reference in their entirety.

BACKGROUND

The development of a dynamic memory pursues high speed, high integration density, low power consumption, and the like. With the miniaturization of the structure size of a semiconductor device, particularly, in a manufacturing procedure of a dynamic random access memory (DRAM) with the critical size smaller than 20 nm, a higher demand on various aspects such as the material, the shape, the size and the electrical property of a bit line is made.

SUMMARY

The disclosure relates generally to the technical field of a semiconductor, and more specifically to a semiconductor structure and a manufacturing method thereof.

The disclosure provides a semiconductor structure and a manufacturing method thereof, to improve the stability of a bit line.

According to a first aspect of the disclosure, a semiconductor structure is provided, which includes a substrate with a groove set therein, a bit line, and a first isolation layer.

A bottom end of the bit line is set in the groove.

The first isolation layer is at least partially set on a sidewall of the bit line, and the first isolation layer is in direct contact with the bit line.

The groove is filled with the first isolation layer.

In one embodiment of the disclosure, the first isolation layer include: a first sidewall isolation section which is set on the sidewall of the bit line and fills the groove, and a first horizontal isolation section which is set on an area of the substrate that is outside of the groove.

In one embodiment of the disclosure, the bit line includes a bit line contact part set on the groove, a bit line metal part connected with one end of the bit line contact part away from the substrate, and an insulation part connected with one end of the bit line metal part away from the bit line contact part.

The first horizontal isolation section is not higher than a bottom end of the bit line metal part.

In one embodiment of the disclosure, the thickness of the first horizontal isolation section is 10 nm-80 nm.

In one embodiment of the disclosure, the semiconductor structure further includes a second isolation layer, which is at least partially set on one side of the first isolation layer away from the bit line.

The first isolation layer and the second isolation layer are layers of different materials.

In one embodiment of the disclosure, the semiconductor structure further includes a third isolation layer, which is at least partially set on one side of the second isolation layer away from the first isolation layer.

The second isolation layer and the third isolation layer are layers of different materials.

According to a second aspect of the disclosure, a method for manufacturing a semiconductor structure is provided. The method includes the following operations.

A substrate with a groove is provided.

A bit line is formed on the substrate, such that a bottom of the bit line is located in the groove.

A first isolation layer is formed on a sidewall of the bit line such that the first isolation layer fills up the groove.

In one embodiment of the disclosure, the operation that a first isolation layer is formed may include the following operations.

First insulation material fills up the groove and covers the substrate and the sidewall of the bit line.

The first insulation material is laterally etched to form the first isolation layer.

The first isolation layer includes a first sidewall isolation section and a first horizontal isolation section, in which the first sidewall isolation section is set on the sidewall of the bit line and fills the groove, and the first horizontal isolation section is set on an area of the substrate that is located outside of the groove.

In one embodiment of the disclosure, the first isolation layer and the third isolation layer are both silicon nitride, and the second isolation layer is silicon oxide.

In one embodiment of the disclosure, a part of the second isolation layer is located at an end part of the bit line, and the third isolation layer completely covers the second isolation layer.

In one embodiment of the disclosure, the third isolation layer includes a second sidewall isolation section which is set on the sidewall of the second isolation layer, and a second horizontal isolation section which is set on one side of the first isolation layer away from the substrate.

In one embodiment of the disclosure, the method for manufacturing a semiconductor structure further includes the following operation.

A second isolation layer is formed on one side of the first isolation layer away from the bit line.

The first isolation layer and the second isolation layer are layers of different materials.

In one embodiment of the disclosure, the operation that a second isolation layer is formed includes the following operations.

Second insulation material is deposited to completely cover the first isolation layer.

The second insulation material is etched, and the first horizontal isolation section of the first isolation layer is exposed so as to form the second isolation layer.

In one embodiment of the disclosure, the method for manufacturing a semiconductor structure may further include the following operation.

A third isolation layer is formed on one side of the second isolation layer away from the first isolation layer.

The second isolation layer and the third isolation layer are layers of different materials.

In one embodiment of the disclosure, the operation that a third isolation layer is formed includes the following operation.

Third insulation material is deposited to completely cover the end part of the second isolation layer, the sidewall of the second isolation layer and the first horizontal isolation section of the first isolation layer so as to form the third isolation layer.

According to the semiconductor structure of the disclosure, the bottom of the bit line is set in the groove, and the first isolation layer for isolating the bit line fills the groove and fills up the groove, that is, a reliable insulation structure is formed at the bottom of the bit line, thereby improving the stability of the bit line.

BRIEF DESCRIPTION OF THE DRAWINGS

Various objects, features, and advantages of the disclosure will become more apparent from the following detailed description of preferred embodiments of the disclosure when considered in combination with the accompanying drawings. The drawings are merely exemplary illustrations of the disclosure and are not necessarily drawn to scale. In the drawings, the same reference numerals refer to the same or similar parts throughout.

Figure 1:
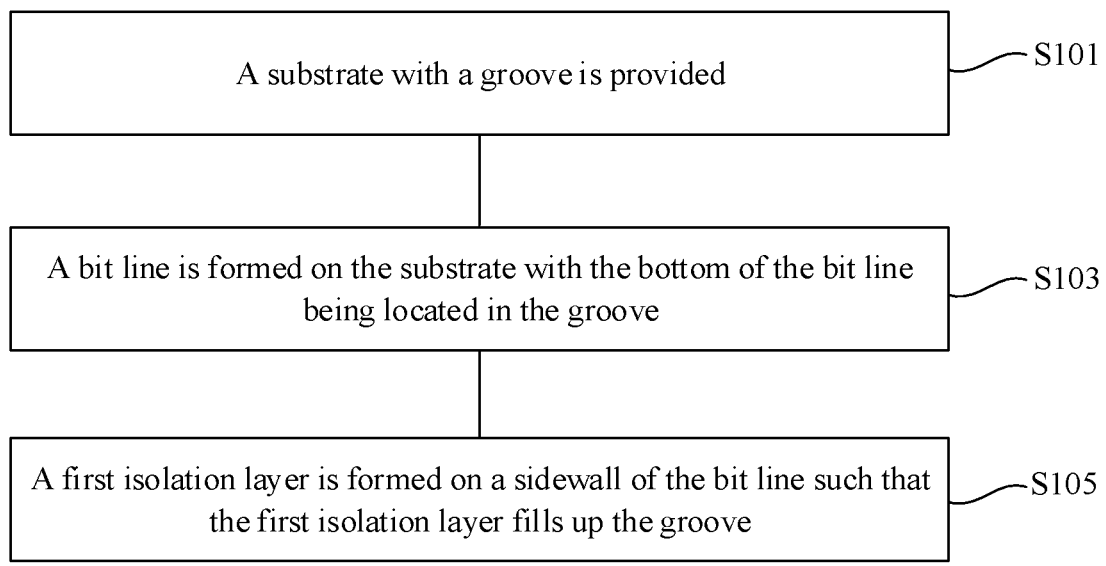
FIG. 1 is a flow chart of a method for manufacturing a semiconductor structure shown according to an exemplary example.

Reference numerals are illustrated as follows.

10 substrate; 11 groove; 12 base board; 13 insulation isolation part; 14 insulation part; 20 bit line; 21 bit line contact part; 22 bit line metal part; 23 insulation part; 30 a first isolation layer; 31 first sidewall isolation section; 32 first horizontal isolation section; 33 first insulation material; 40 second isolation layer; 41 second insulation material; 50 third isolation layer; 51 second sidewall isolation section; 52 second horizontal isolation section; and 53 third insulation material.

DETAILED DESCRIPTION

Typical examples that embody the features and advantages of the disclosure will be described in detail in the following description. It is to be understood that the disclosure can be changed in different examples without departing from the scope of the disclosure, and that the description and drawings are illustrative in nature and are not intended to limit the disclosure.

In the following description of different exemplary examples of the disclosure, reference is made to the accompanying drawings, which form a part of the disclosure, and in which different exemplary structures, systems, and steps for implementing various aspects of the disclosure are shown by way of an example. It is to be understood that other specific arrangements of a component, a structure, an exemplary device, a system, and a step may be utilized, and a structural and functional modification may be made without departing from the scope of the disclosure. Moreover, although terms "on", "between", "in", and the like may be used in the specification to describe different exemplary features and elements of the disclosure, these terms are used herein for convenience only, for example, according to a direction of the example in the drawings. Any content in the specification should not be construed as requiring a particular three-dimensional direction of the structure to fall within the scope of the disclosure.

With the reduction of the critical size of the bit line in a process flow, the critical size may even be smaller than 10 nm according to a product requirement. Therefore, the problem of the poor stability of the bit line is prone to occur.

One example of the disclosure provides a semiconductor structure, referring to FIG. 2 to FIG. 7, the semiconductor structure includes: a substrate 10, in which a groove 11 is set on the substrate 10; a bit line 20, the bottom end of which is set in the groove 11; and a first isolation layer 30, which is at least partially set on a sidewall of the bit line 20, and is in direct contact with the bit line 20. The groove 11 is filled with the first isolation layer 30.

According to the semiconductor structure of one example of the disclosure, the bottom of the bit line 20 is set in the groove 11, and the first isolation layer 30 for isolating the bit line 20 fills the groove 11 and fills up the groove 11, that is, a reliable insulation structure is formed at the lower part of the bit line 20, thereby improving the stability of the bit line 20.

Figure 2:
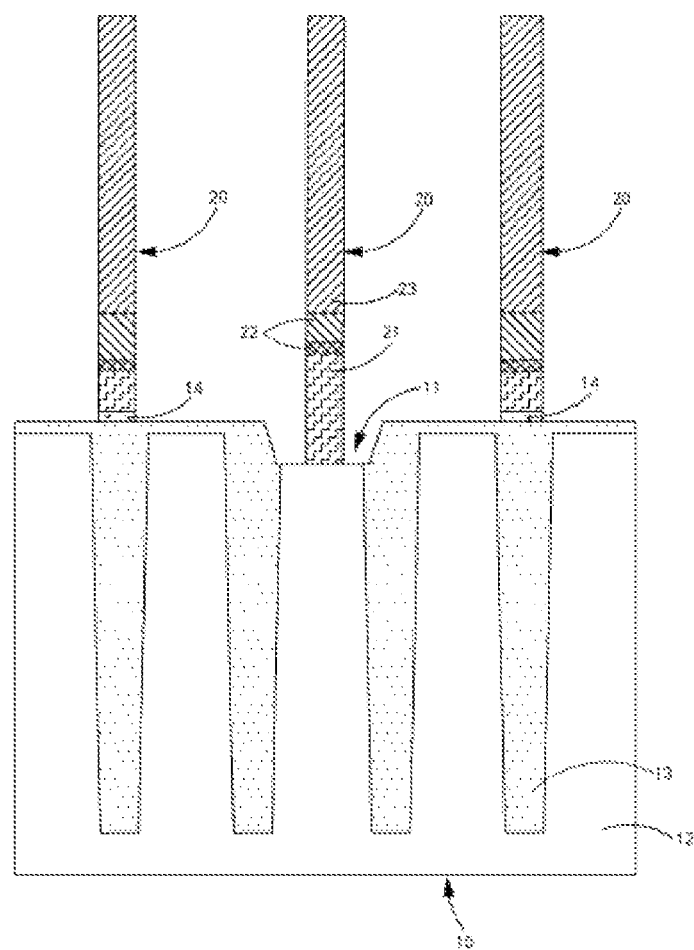
FIG. 2 is a structural schematic diagram after a bit line is formed according to a method for manufacturing a semiconductor structure shown in an exemplary example.

Specifically, a bottom end of the bit line 20 is located in the groove 11, that is, a gap is formed between the sidewall of the bit line 20 and the sidewall of the groove 11. Referring to FIG. 2, the gap is formed on both sides of the bit line 20. After the gap is filled up with the first isolation layer 30, a formed insulation structure is similar to a dual-kidney structure. The material filled in the groove 11 is same as the material for forming the first isolation layer 30, that is, the groove 11 is filled during the formation of the first isolation layer 30.

It is to be noted that the bottom end of the bit line 20 is located in the middle of the groove 11, that is, the gap is formed between a circumferential sidewall of the bit line 20 and the sidewall of the groove 11. The first isolation layer 30 wraps the bit line 20. The top of the bit line 20 may be covered with the first isolation layer 30. Alternatively, it may not be covered with the first isolation layer 30.

Due to the groove 11 and the first isolation layer 30 filling up the groove 11, the bit line 20 may be more stable. That is, the base of the bit line 20 is relatively large, the depth is relatively large, and the stability is relatively high.

In one example, the substrate 10 may include a semiconductor substrate. The semiconductor substrate may be formed of a silicon-containing material. The semiconductor substrate may be formed of any suitable material, for example, at least one of silicon, monocrystalline silicon, polycrystalline silicon, amorphous silicon, silicon-germanium, monocrystalline silicon-germanium, polycrystalline silicon-germanium, and carbon-doped silicon.

Specifically, in combination with FIG. 2, the substrate 10 includes a base board 12, an insulation isolation part 13, and an insulation part 14. The insulation isolation part 13 is set on the substrate 10 and is partially located within the substrate 10. The insulation part 14 is located on the insulation isolation part 13. The base board 12 may be formed of silicon-containing material, for example, the base board 12 may be silicon. The insulation isolation part 13 may be formed of material including silicon oxide, silicon nitride, or a combination thereof, for example, the insulation isolation part 13 may be silicon dioxide. The insulation part 14 may be formed of a material including silicon nitride, for example, be formed of silicon nitride.

In one example, as shown in FIG. 2, the semiconductor structure includes a plurality of separate bit lines 20, which are spaced. A part of each bit line 20 may be directly set on the substrate 10, that is, may not be set in the groove 11.

In one example, the first isolation layer 30 includes: a first sidewall isolation section 31, which is set on a sidewall of the bit line 20 and fills the groove 11; and a first horizontal isolation section 32, which is set on an area of the substrate 10 that is located outside of the groove 11.

Figure 4:
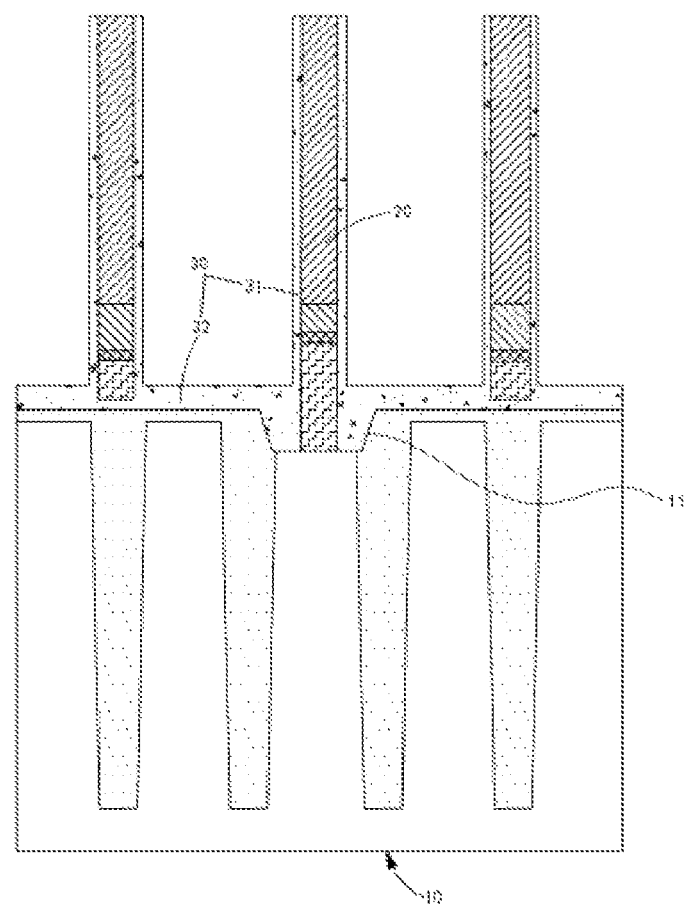
FIG. 4 is a structural schematic diagram after a first isolation layer is formed according to a method for manufacturing a semiconductor structure shown in an exemplary example.

As explained in combination with FIG. 4, the first sidewall isolation section 31 is wrapped on the sidewall of the bit line 20, that is, the first sidewall isolation section 31 fills up the groove 11; and the first horizontal isolation section 32 is set on an upper surface of the substrate 10, thereby forming an insulation layer on the upper surface of the substrate 10. The first horizontal isolation section 32 may support the bit line 20, thereby avoiding deformation and inclination of the bit line 20.

In one example, the first isolation layer 30 may cover the top of the bit line 20.

In one example, the bit line 20 includes a bit line contact part 21, which is set on the groove 11; a bit line metal part 22, the bit line metal part 22 which is connected with one end of the bit line contact part 21 away from the substrate 10; and an insulation part 23, which is connected with one end of the bit line metal part 22 away from the bit line contact part 21. The first horizontal isolation section 32 is not higher than a bottom end of the bit line metal part 22, thereby ensuring the working performance of the bit line 20.

Specifically, as illustrated in combination with FIG. 2 and FIG. 4, the bit line contact part 21 is connected with the substrate 10, that is, the bit line contact part 21 is connected with a bottom wall of the groove, and the bottom of the bit line contact part 21 is located in the groove 11. The bit line contact part 21 may be made of silicon-containing material. The bit line contact part 21 may include polycrystalline silicon, doped polycrystalline silicon, epitaxial silicon, or doped epitaxial silicon, for example, the bit line contact part 21 may be polycrystalline silicon.

The bit line metal part 22 is connected with the bit line contact part 21. The bit line metal part 22 may include at least one of tungsten nitride (WN), molybdenum nitride (MoN), titanium nitride (TIN), tantalum nitride (TaN), titanium silicon nitride (TiSiN), tantalum silicon nitride (TaSiN), or tungsten (W).

For example, in some examples, the bit line metal part 22 includes the titanium nitride (TIN) and the tungsten (W). The titanium nitride (TIN) is connected with the bit line contact part 21, and the tungsten (W) is connected with insulation part 23. In FIG. 2, the bit line metal part 22 includes lower layer material (titanium nitride) and upper layer material (tungsten).

The insulation part 23 is connected with the bit line metal part 22. The insulation part 23 may be formed of material including silicon oxide, silicon nitride, or a combination thereof, for example, the insulation part 23 may be the silicon nitride.

In some examples, the insulation part 23 is the silicon nitride. At this time, the first isolation layer 30 may be the silicon nitride or the silicon oxide.

In one example, the thickness of the first horizontal isolation section 32 is 10 nm-80 nm to ensure the structure stability of the bit line 20, such that the bit line will not be influenced by subsequent processes, and will be prevented from bending or collapsing.

In one example, the thickness of the first sidewall isolation section 31 is greater than 1 nm.

In one example, the semiconductor structure further includes: a second isolation layer 40, which is at least partially set on one side of the first isolation layer 30 away from the bit line 20. The first isolation layer 30 and the second isolation layer 40 are layers of different materials.

Figure 6:
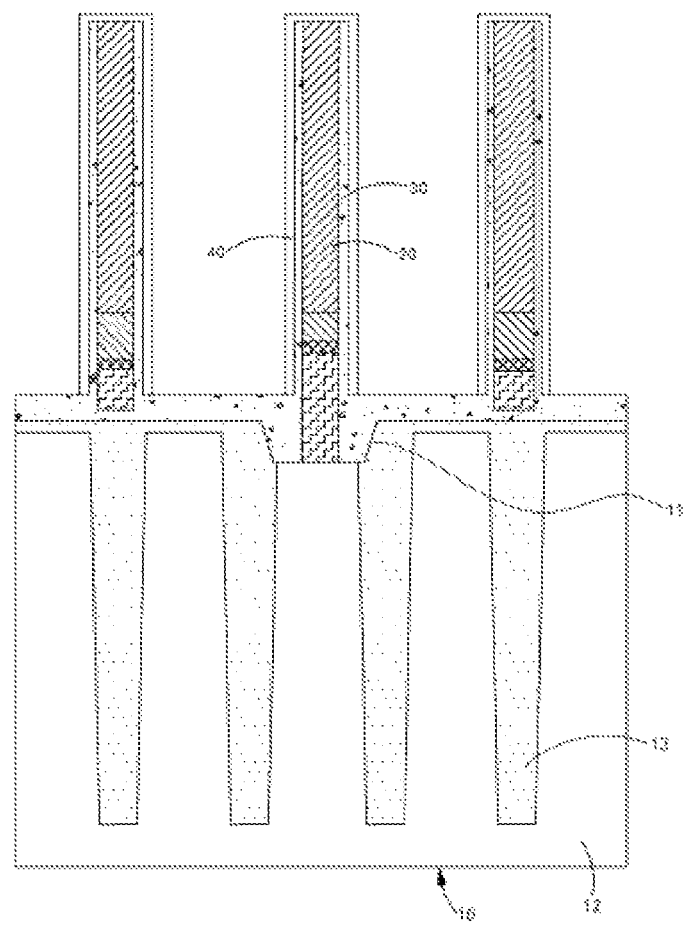
FIG. 6 is a structural schematic diagram after a second isolation layer is formed according to a method for manufacturing a semiconductor structure shown in an exemplary example.

As explained in combination with FIG. 6, the second isolation layer 40 covers the first isolation layer 30 to form two insulation layers of two different materials on the sidewall of the bit line 20, thereby ensuring low stray capacitance and low coupling effect.

In some examples, the first isolation layer 30 may be formed of a material including silicon oxide, silicon nitride, or a combination thereof, and the second isolation layer 40 may be formed of the material including the silicon oxide, the silicon nitride, or the combination thereof.

For example, in some examples, the first isolation layer 30 is the silicon nitride, and the second isolation layer 40 is the silicon oxide.

In some examples, the first isolation layer 30 is the silicon oxide, and the second isolation layer 40 is the silicon nitride.

Figure 7:
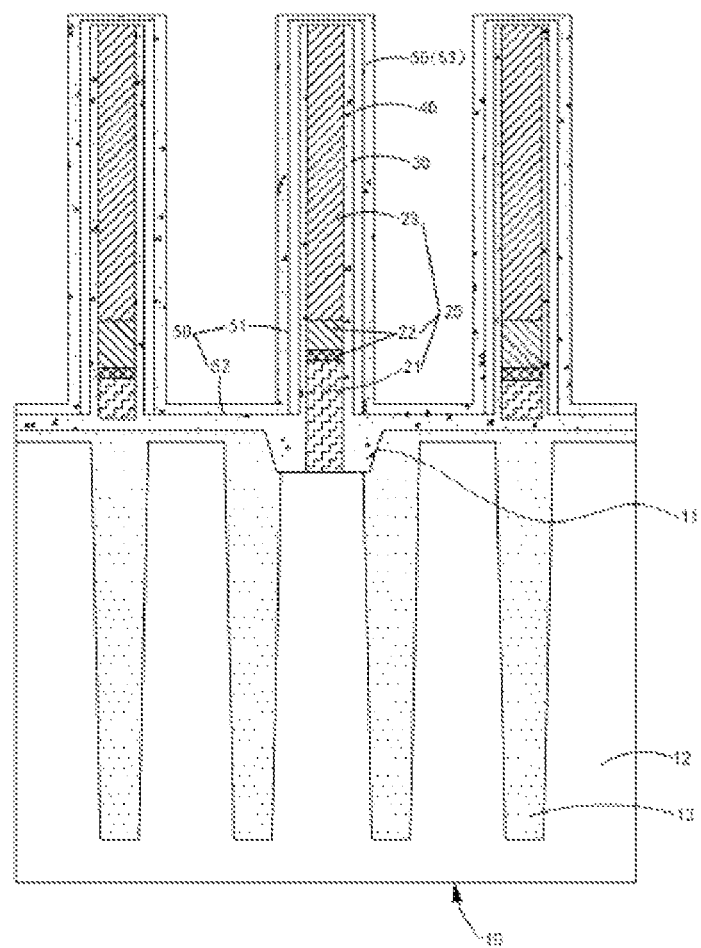
FIG. 7 is a structural schematic diagram after a third isolation layer is formed according to a method for manufacturing a semiconductor structure shown in an exemplary example.

In one example, as shown in FIG. 7, the semiconductor structure further includes. a third isolation layer 50, which is at least partially set on one side of the second isolation layer 40 away from the first isolation layer 30. The second isolation layer 40 and the third isolation layer 50 are of different materials. The third isolation layer 50 further improves external insulation performance of the bit line 20.

In some examples, the first isolation layer 30 may be formed of the material including the silicon oxide, the silicon nitride, or the combination thereof, and the second isolation layer 40 may be formed of the material including the silicon oxide, the silicon nitride, or the combination thereof. The third isolation layer 50 may be formed of the material including the silicon oxide, the silicon nitride, or the combination thereof.

For example, in some examples, the first isolation layer 30 is the silicon nitride, the second isolation layer 40 is the silicon oxide, and the third isolation layer 50 is the silicon nitride. A silicon nitride-silicon oxide-silicon nitride NON stack structure is one of the optimal insulation as a low-K dielectric material structure. Due to good insulation performance and a low dielectric constant, the NON stack structure is applied to a semiconductor manufacturing process as a common insulation structure, so that an increasingly strict low-k requirement of a semiconductor may be met.

In some examples, the first isolation layer 30 is the silicon oxide, the second isolation layer 40 is the silicon nitride, and the third isolation layer 50 is the silicon oxide.

In one example, the first isolation layer 30 and the third isolation layer 50 are both the silicon nitride, the second isolation layer 40 is the silicon oxide, and the insulation part 23 is the silicon nitride.

In one example, a part of the second isolation layer 40 is located on the top of the bit line 20, and the third isolation layer 50 completely covers the second isolation layer 40.

Specifically, as illustrated in combination with FIG. 7, the sidewall of the bit line 20 sequentially includes the first isolation layer 30, the second isolation layer 40, and the third isolation layer 50 from the inside to the outside, and the top of the bit line 20 may include the second isolation layer 40 and the third isolation layer 50. When the insulation part 23 and the first isolation layer 30 are of the same material, the whole outer surface of the bit line 20 includes three isolation layers.

Of course, it is not excluded that the first isolation layer 30 is set on the top of the bit line 20, which is not limited here, and a corresponding choice may be made according to a practical requirement.

In one example, the third isolation layer 50 includes a second sidewall isolation section 51, the second sidewall isolation section 51 which is set on the sidewall of the second isolation layer 40; and a second horizontal isolation section 52, the second horizontal isolation section 52 which is set on one side of the first isolation layer 30 away from the substrate 10.

Specifically, as explained in combination with FIG. 4 and FIG. 7, the first sidewall isolation section 31 of the first isolation layer 30, the second isolation layer 40, and the second sidewall isolation layer 51 are sequentially set on the sidewall of the bit line 20 from inside to outside, and the second isolation layer 40 only wraps an outer surface of the bit line 20, that is, the second horizontal isolation section 52 of the third isolation layer 50 is in direct contact with the first horizontal isolation section 32 of the first isolation layer 30.

Of course, in some examples, the second isolation layer 40 may also be set between the second horizontal isolation section 52 and the first horizontal isolation section 32.

An example of the disclosure further provides a method for manufacturing a semiconductor structure. Referring to FIG. 1, the method for manufacturing a semiconductor structure includes the following operations.

At S101, a substrate 10 with a groove 11 is provided.

At S103, a bit line 20 is formed on the substrate 10, such that the bottom of the bit line 20 is located in the groove 11.

At S105, a first isolation layer 30 is formed on a sidewall of the bit line 20 and the first isolation layer 30 fills up the groove 11.

According to the method for manufacturing a semiconductor structure of one example of the disclosure, one end of the bit line 20 is formed in the groove 11, and the first isolation layer 30 is formed on the sidewall of the bit line 20, and the first isolation layer 30 fills up the groove 11, so that a leakage phenomenon of the bit line 20 may be effectively prevented. The first isolation layer 30 located in the groove 11 may also effectively support the bit line 20, which ensures that the bit line 20 will not twist and collapse in subsequent processes.

It is to be noted that a formation method of the groove 11 on the substrate 10 is not limited here, and the groove 11 may be formed by a molding method in the related art, for example, forming the groove 11 by etching. Accordingly, the formation method of the bit line 20 is not limited herein, and the shaping method in the related art may be used. The example highlights the filling of the groove 11 during the formation of the first isolation layer 30.

In one example, the first isolation layer 30 is formed, with the following operations. A first insulation material 33 fills up the groove 11 and covers the substrate 10 and the sidewall of the bit line 20. The first insulation material 33 is laterally etched to form the first isolation layer 30. The first isolation layer 30 includes the first sidewall isolation section 31 and the first horizontal isolation section 32, in which the first sidewall isolation section 31 is set on the sidewall of the bit line 20 and fills the groove 11, and the first horizontal isolation section 32 is set on an area the substrate 10 that is located outside of the groove 11. The thickness of the first horizontal isolation section 32 is 10 nm-80 nm.

Figure 3:
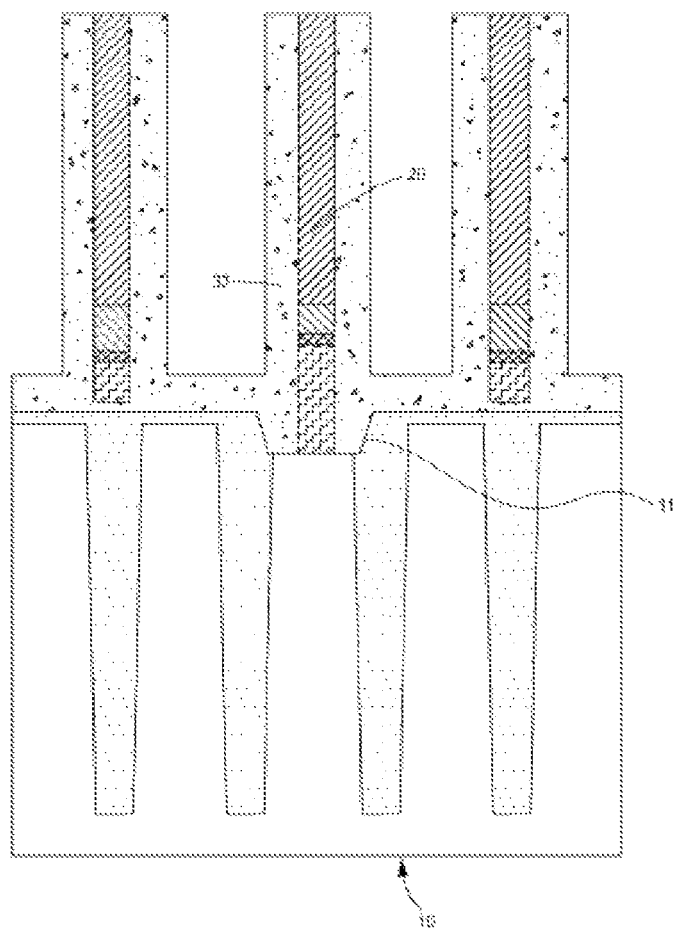
FIG. 3 is a structural schematic diagram after first insulation material is formed according to a method for manufacturing a semiconductor structure shown in an exemplary example.

As shown in FIG. 2, the bit line 20 is formed in the groove 11 of the substrate 10, and on the basis of the structure shown in FIG. 2, the first insulation material 33 (actually an insulation layer structure) is formed by using a chemical vapor deposition (CVD) process or an atomic layer deposition (ALD) process, as shown in FIG. 3. Formation with the above manner ensures uniformity and compactness of the subsequently formed first isolation layer 30.

Specifically, at the lower portion of the bit line 20, that is, in the groove 11, the first insulation material 33 is first filled in by using the chemical vapor deposition process or the atomic layer deposition process. Then the chemical vapor deposition process or the atomic layer deposition process is used to completely cover the sidewall of the bit line 20 with the first insulation material 33. Therefore, it is ensured that the bit line 20 is sufficiently stable and that the first insulation material 33 covers an upper surface of the substrate 10.

After a structure shown in FIG. 3 is formed, the first insulation material 33 is laterally etched by using a dry etching process or a vapor wet etching process, so that the sidewall of the first insulation material 33 has the desired thickness (that is, forming the first sidewall isolation section 31). It is also ensured that the bottom has the sufficient thickness, so that the bit line 20 will not have a risk of inclining or collapsing (that is, the thickness of the formed first horizontal isolation section 32 is 10 nm-80 nm), as shown in FIG. 4.

In one example, the first insulation material 33 may be silicon nitride.

It is to be noted that the dry etching may use a plasma silicon oxide dry etching apparatus. A fluorine-containing gas is used as a formulation of the dray etching. RF power of a plasma generator is sufficiently high (typically, 300 W-2000 W or 300-2000 V). The RF power of plasma acceleration is sufficiently low (typically, lower than 500 W or 500 V). Chamber pressure is sufficiently high (greater than 5 millitorr). During etching, consumption of the bottom first insulation material 33 (for example, the silicon nitride) is ensured to be sufficiently low, and controllability of the consumption of the first insulation material 33 on the sidewall is ensured.

Accordingly, the wet etching may be performed by using a vapor wet etching manner. During the wet etching, it is also necessary to ensure that the consumption of the bottom first insulation material 33 (for example, the silicon nitride) is sufficiently low, and the controllability of the consumption of the sidewall first insulation material 33 is ensured.

In addition, the thickness of the first sidewall isolation section 31 is controlled by dry etching or wet etching to ensure that the thickness of the sidewall is greater than 1 nm. As for the dry etching, it may be controlled by such as etching time, pressure, power, temperature, gas ratio and the like. As for the wet etching, it may be controlled by wet etching time, temperature, steam pressure and chemical dosage ratio.

In one example, the method for manufacturing a semiconductor structure further includes that: a second isolation layer 40 is formed on one side of the first isolation layer 30 away from the bit line 20. The first isolation layer 30 and the second isolation layer 40 are of different materials.

In one example, the operation that a second isolation layer 40 is formed includes that second insulation material 41 is deposited to completely cover the first isolation layer 30; and the second insulation material 41 is etched and the first horizontal isolation section 32 of the first isolation layer 30 is exposed to form the second isolation layer 40.

Figure 5:
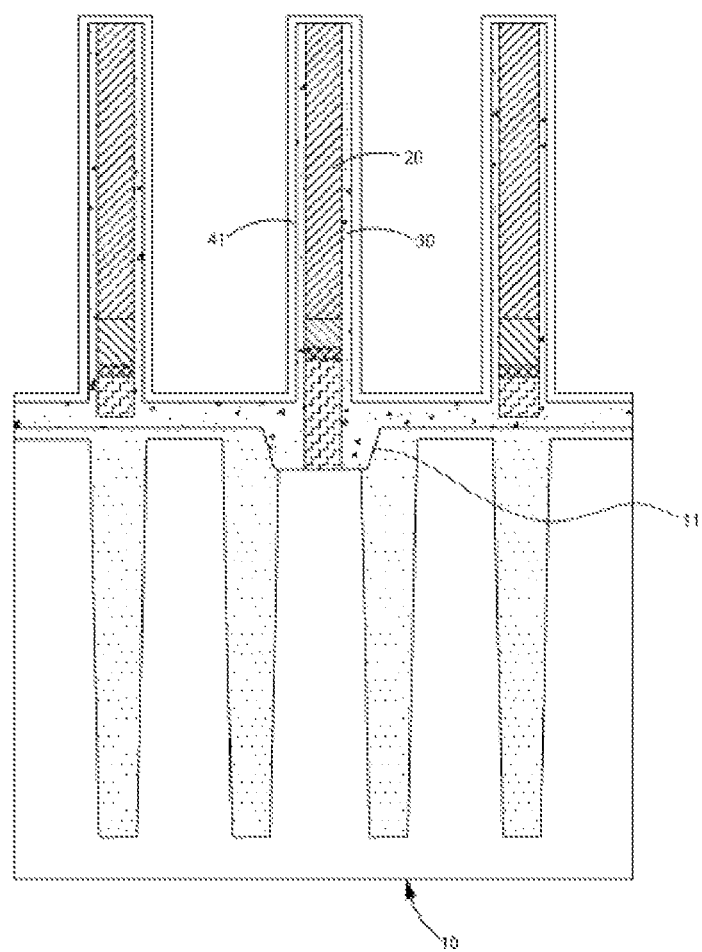
FIG. 5 is a structural schematic diagram after second insulation material is formed according to a method for manufacturing a semiconductor structure shown in an exemplary example.

Specifically, on the basis of FIG. 4, the second insulation material 41 (actually an insulation layer structure) is deposited by the chemical vapor deposition process or the atomic layer deposition process, as shown in FIG. 5.

The lower portion of the second insulation material 41 is etched by the dry etching process or the vapor wet etching process. The lower portion of the second insulation material 41 is completely cleared to expose the first isolation layer 30, as shown in FIG. 6.

In one example, the second insulation material 41 may be silicon oxide.

In one example, the method for manufacturing a semiconductor structure further includes that a third isolation layer 50 is formed on one side of the second isolation layer 40 away from the first isolation layer 30. The second isolation layer 40 and the third isolation layer 50 are of different materials.

In one example, the operation that a third isolation layer 50 is formed includes that: the third insulation material 53 completely covers an end part of the second isolation layer 40, the sidewall of the second isolation layer 40, and the first horizontal isolation section 32 of the first isolation layer 30, so that the third isolation layer 50 is formed.

Specifically, on the basis of the structure shown in FIG. 6, the third insulation material 53 (actually an insulation layer structure) is formed by the chemical vapor deposition process or the atomic layer deposition process, to form the third insulation layer 50 as shown in FIG. 7.

In one example, the third insulation material 53 may be the silicon nitride.

In one example, the method for manufacturing a semiconductor structure may be used to prepare the above semiconductor structure.

According to the method for manufacturing a semiconductor structure of the disclosure, an effective and practical manufacturing flow is provided for an optimization for solving the problem that a bit line structure is prone to bend or collapse in a wet cleaning process in a manufacturing procedure in which the size of the bit line is smaller than 20 nm. The stability of the bit line structure is improved by changing the thickness of the insulation material of the bit line, so that the risk of distortion and collapsing of the bit line is reduced, a stable structure of silicon nitride-silicon oxide-silicon nitride is formed, and the formation of coupling parasitic capacitance of a DRAM circuit is reduced.

Other examples of the disclosure will be apparent to those skilled in the art from consideration of the specification and practice of the disclosure disclosed here. The disclosure is intended to cover any variations, uses, or adaptations of the disclosure, and the variations, uses, or adaptations follow the general principles of the disclosure and include common general knowledge or conventional technical means in the art undisclosed by the disclosure. The specification and examples are considered as exemplary only, and a true scope and spirit of the disclosure are indicated by the foregoing claims.

It will be appreciated that the disclosure is not limited to the exact construction that has been described above and illustrated in the accompanying drawings, and that various modifications and changes can be made without departing from the scope thereof. It is intended that the scope of the disclosure is only limited by the appended claims.

What is claimed is:

1. A semiconductor structure, comprising:
   a substrate, a groove being set in the substrate;
   a bit line, a bottom end of the bit line being set in the groove; and
   a first isolation layer, the first isolation layer being at least partially set on a sidewall of the bit line, and the first isolation layer being in direct contact with the bit line,
   wherein the groove is filled with the first isolation layer;
   wherein the first isolation layer comprises:
   a first sidewall isolation section, the first sidewall isolation section being set on the sidewall of the bit line and filling the groove; and
   a first horizontal isolation section, the first horizontal isolation section being set on an area of the substrate that is outside of the groove;
   wherein the semiconductor structure is manufactured by a method comprising:
   providing the substrate with the groove;
   forming the bit line on the substrate such that the bottom end of the bit line is located in the groove; and
   forming the first isolation layer on the sidewall of the bit line such that the first isolation layer fills up the groove;
   wherein forming the first isolation layer comprises:
   filling up the groove with a first insulation material, and covering the substrate and the sidewall of the bit line; and
   laterally etching the first insulation material to form the first isolation layer.

2. The semiconductor structure of claim 1, wherein the bit line comprises:
   a bit line contact part, the bit line contact part being set on the groove;
   a bit line metal part, the bit line metal part being connected with one end of the bit line contact part away from the substrate; and
   an insulation part, the insulation part being connected with one end of the bit line metal part away from the bit line contact part,
   wherein the first horizontal isolation section is not higher than a bottom end of the bit line metal part.

3. The semiconductor structure of claim 1, wherein a thickness of the first horizontal isolation section is 10 nm-80 nm.

4. The semiconductor structure of claim 1, further comprising:
   a second isolation layer, the second isolation layer being at least partially set on one side of the first isolation layer away from the bit line,
   wherein the first isolation layer and the second isolation layer are layers of different materials.

5. The semiconductor structure of claim 1, further comprising:
   a second isolation layer, the second isolation layer being at least partially set on one side of the first isolation layer away from the bit line,
   wherein the first isolation layer and the second isolation layer are layers of different materials.

6. The semiconductor structure of claim 2, further comprising:
   a second isolation layer, the second isolation layer being at least partially set on one side of the first isolation layer away from the bit line,
   wherein the first isolation layer and the second isolation layer are layers of different materials.

7. The semiconductor structure of claim 3, further comprising:
   a second isolation layer, the second isolation layer being at least partially set on one side of the first isolation layer away from the bit line,
   wherein the first isolation layer and the second isolation layer are layers of different materials.

8. The semiconductor structure of claim 4, further comprising:
   a third isolation layer, the third isolation layer being at least partially set on one side of the second isolation layer away from the first isolation layer,
   wherein the second isolation layer and the third isolation layer are layers of different materials.

9. The semiconductor structure of claim 8, wherein the first isolation layer and the third isolation layer are silicon nitride, and the second isolation layer is silicon oxide.

10. The semiconductor structure of claim 8, wherein a part of the second isolation layer is located at an end part of the bit line, and the third isolation layer completely covers the second isolation layer.

11. The semiconductor structure of claim 8, wherein the third isolation layer comprises:
   a second sidewall isolation section, the second sidewall isolation section being set on the sidewall of the second isolation layer; and
   a second horizontal isolation section, the second horizontal isolation section being set on one side of the first isolation layer away from the substrate.

12. A method for manufacturing a semiconductor structure, comprising:
   providing a substrate with a groove;
   forming a bit line on the substrate such that a bottom of the bit line is located in the groove; and
   forming a first isolation layer on a sidewall of the bit line such that the first isolation layer fills up the groove;
   wherein forming the first isolation layer comprises:
   filling up the groove with a first insulation material, and covering the substrate and the sidewall of the bit line; and
   laterally etching the first insulation material to form the first isolation layer,
   wherein the first isolation layer comprises a first sidewall isolation section and a first horizontal isolation section, in which the first sidewall isolation section is set on the sidewall of the bit line and fills the groove, and the first horizontal isolation section is set on an area of the substrate that is outside of the groove.

13. The method for manufacturing a semiconductor structure of claim 12, further comprising:
   forming a second isolation layer on one side of the first isolation layer away from the bit line,
   wherein the first isolation layer and the second isolation layer are layers of different materials.

14. The method for manufacturing a semiconductor structure of claim 13, further comprising:
   forming a third isolation layer on one side of the second isolation layer away from the first isolation layer,
   wherein the second isolation layer and the third isolation layer are layers of different materials.

15. The method for manufacturing a semiconductor structure of claim 14, wherein forming the third isolation layer comprises:
   completely covering an end part of the second isolation layer, a sidewall of the second isolation layer and the first horizontal isolation section of the first isolation layer with a third insulation material to form the third isolation layer.

16. The method for manufacturing a semiconductor structure of claim 13, wherein forming the second isolation layer comprises:
   completely covering the first isolation layer with a second insulation material; and
   etching the second insulation material to expose the first horizontal isolation section of the first isolation layer so as to form the second isolation layer.

17. The method for manufacturing a semiconductor structure of claim 16, further comprising:
   forming a third isolation layer on one side of the second isolation layer away from the first isolation layer,
   wherein the second isolation layer and the third isolation layer are layers of different materials.

18. The method for manufacturing a semiconductor structure of claim 17, wherein forming the third isolation layer comprises:
   completely covering an end part of the second isolation layer, a sidewall of the second isolation layer and the first horizontal isolation section of the first isolation layer with a third insulation material to form the third isolation layer.

* * * * *